(12) United States Patent
Ruppi

(10) Patent No.: US 6,251,508 B1
(45) Date of Patent: Jun. 26, 2001

(54) GRADE FOR CAST IRON

(75) Inventor: Sakari Ruppi, Fagersta (SE)

(73) Assignee: Seco Tools AB, Fagersta (SE)

( * ) Notice: Subject to any disclaimer, the term of this patent is extended or adjusted under 35 U.S.C. 154(b) by 0 days.

(21) Appl. No.: 09/207,688

(22) Filed: Dec. 9, 1998

(51) Int. Cl.[7] .................................................. B32B 9/00
(52) U.S. Cl. ..................... 428/216; 428/212; 428/323; 428/325; 428/336; 428/697; 428/698; 428/699; 428/701; 428/702
(58) Field of Search ........................... 407/119; 428/216, 428/212, 336, 697, 698, 699, 701, 702, 323, 325

(56) References Cited

U.S. PATENT DOCUMENTS

| | | | |
|---|---|---|---|
| 4,714,660 | * 12/1987 | Gates, Jr. | 428/698 |
| 5,137,774 | 8/1992 | Ruppi . | |
| 5,635,247 | 6/1997 | Ruppi . | |
| 5,652,045 | * 7/1997 | Nakamura et al. | 428/216 |
| 5,700,569 | 12/1997 | Ruppi . | |
| 5,863,640 | * 1/1999 | Ljungberg et al. | 428/216 |
| 5,871,850 | * 2/1999 | Moriguchi et al. | 428/332 |
| 5,879,823 | * 3/1999 | Prizzi et al. | 428/697 |
| 5,915,162 | * 6/1999 | Uchino et al. | 428/699 |
| 5,920,760 | * 7/1999 | Yoshimura et al. | 428/551 |
| 5,945,207 | 8/1999 | Kutscher et al. | 428/216 |

FOREIGN PATENT DOCUMENTS

| | | | |
|---|---|---|---|
| 0 594 875 | * | 5/1994 | (EP) . |
| 0 600 115 | * | 6/1994 | (EP) . |
| 0 693 574 | * | 1/1996 | (EP) . |

OTHER PUBLICATIONS

Vuorinen et al., "TEM Study of Microstructure and Crystallography at the TiC/Cemented Carbide Interface", *Science of Hard Materials*, 1983, pp. 433–447 (No Month).

Vuorinen et al., "Interfacial Characterization of Chemically Vapour Deposited Titanium Carbide on Cemented Carbide", *Thin Solid Films*, 232 (1993) pp. 73–82 (No Month).

* cited by examiner

*Primary Examiner*—Archene Turner
(74) *Attorney, Agent, or Firm*—Burns, Doane, Swecker & Mathis, L.L.P.

(57) ABSTRACT

An improved coated cemented carbide insert for the cutting of cast iron is provided. The insert has multi-layer TiCN between the substrate and the $\alpha$-$Al_2O_3$ coating. The innermost portion of the TiCN layer is composed of large columnar grains while the outermost portion is of small equiaxed grains.

17 Claims, 4 Drawing Sheets

FIG. 3a  x 40 SEM
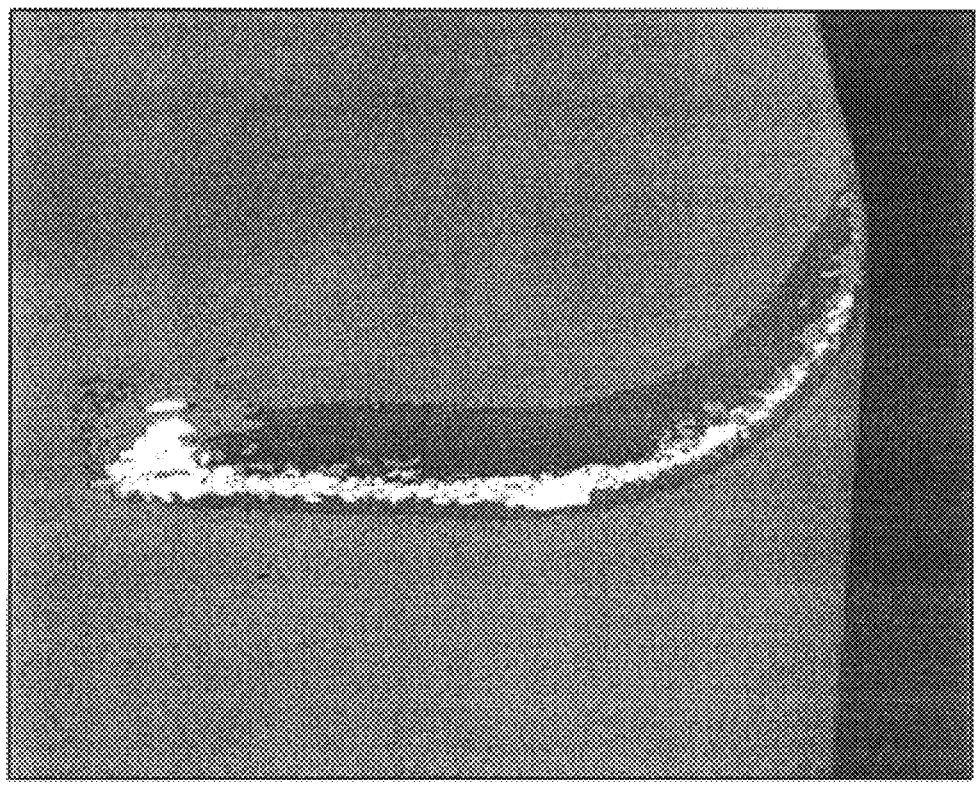
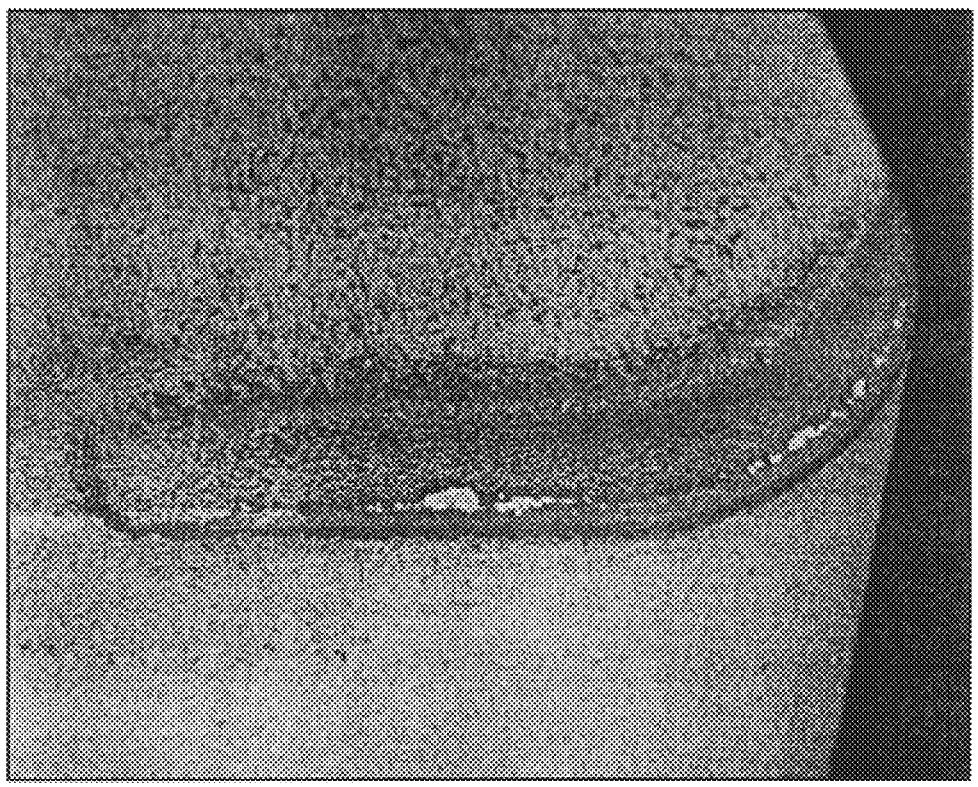
FIG. 3b  x 40 SEM

FIG. 4a  x 29 SEM
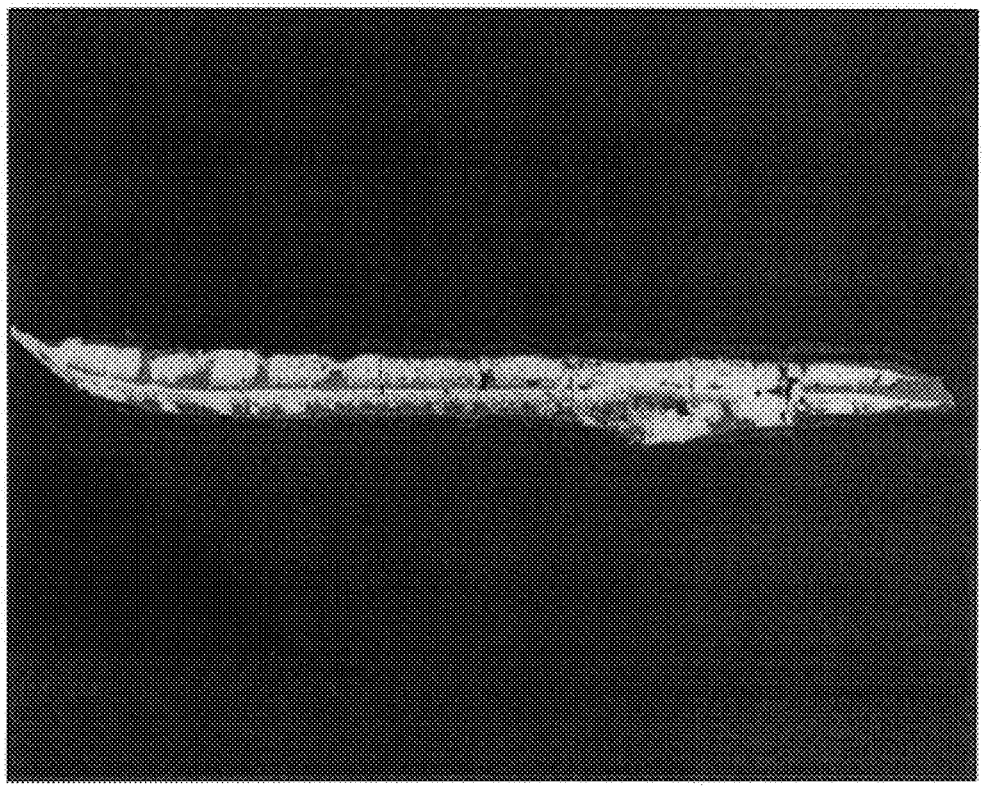
FIG. 4b  x 29 SEM

GRADE FOR CAST IRON

BACKGROUND OF THE INVENTION

In U.S. Pat. No. 5,137,774, the increased performance of α-Al$_2$O$_3$ as compared to κ-Al$_2$O$_3$ as a coating on a cemented carbide insert when turning cast iron was shown. In addition, in U.S. Pat. Nos. 5,635,247 and 5,700,569 as well as U.S. Pat. No. 6,015,614 there are shown various alumina-coated cemented carbide inserts in which the alumina is deposited on a Ti(C,N) layer or multilayers. However, in tests as conducted by the present inventor, it was noticed that the adhesion of an α-Al$_2$O$_3$ layer to the underlying TiCN layer as well as the adhesion of the TiCN layer to the cemented carbide substrate was often unsatisfactory when the insert was used in the turning of cast iron. The coating failed due to edge chipping which resulted in accelerated wear.

The main reasons for edge chipping have been identified by the present inventor from these tests to be the weak substrate-coating adhesion as well as the weak bond between TiCN and α-Al$_2$O$_3$.

In one study of the TiC-cemented carbide interface of a 6 μm thick CVD-deposited TiC layer by Vuorinen et al., "*TEM Study of Microstructure and Crystallography at the TiC/Cemented Carbide Interface*", *Science of Hard Materials*, 1983, pp. 433–447, it was found by transmission electron microscopy (TEM) that the TiC layer is composed of two regions. Close to the substrate and extending to a thickness of 1.5–2 μm is a layer of fine, equiaxed TiC grains. Above that is a layer of larger (typically 2–4 μm) grains of TiC.

In another study published in *Thin Solid Films*, 232 (1993) pp. 73–82, Vuorinen et al., entitled "*Interfacial Characterization of Chemically Vapour Deposited Titanium Carbide on Cemented Carbide*", TiC coatings were CVD-deposited on cemented carbide substrates under non-carburizing conditions. In the absence of η-carbide, it was found that the TiC nucleated and grew epitaxially on both {0001}- and {10$\bar{1}$0}- WC planes.

Because of the increased performance in turning cast iron which is obtained when using a coated cemented carbide insert having an outer layer of α-Al$_2$O$_3$, the search for acceptable inserts has continued.

OBJECTS AND SUMMARY OF THE INVENTION

It is an object of this invention to avoid or alleviate the problems of the prior art.

It is further an object of this invention to provide a coated cemented carbide insert having an alumina outer layer useful in the turning of cast iron with acceptable life.

In one aspect of the invention there is provided a coated cemented carbide body comprising a coated cemented carbide substrate, a multilayer Ti(C,N) intermediate layer and an Al$_2$O$_3$ outer layer wherein the Ti(C,N) intermediate layer comprises a first, inner layer of columnar grained Ti(C,N) and a second, outer layer of equiaxed grained Ti(C,N).

In another aspect of the invention there is provided a coated cemented carbide body comprising a cemented carbide substrate having a series of sequential layers thereon, said layers in order from the substrate being:

(a) a bonding layer having a thickness of up to 1 μm selected from the group consisting of TiC, TiN and Ti(C,N);

(b) a multilayer TiCN layer comprising a first, inner layer of columnar grained Ti(C,N) having a grain width (W) of 0.1–0.5 times the layer thickness and a length (L) of 0.5–0.8 times the total layer thickness and a second, outer layer of equiaxed grains having a grain size of from 0.2 to 1.0 μm, the total thickness of the Ti(C,N) layer being from 3 to 5 μm when used for milling and from 5 to 10 μm when used for turning;

(c) a layer of (TiAl)(CO) having a thickness of from about 0.5 to 3 μm;

(d) an α-Al$_2$O$_3$ layer having a thickness of from about 4 to 10 μm; and (e) an outer layer of about 1 μm or less thickness of TiN.

BRIEF DESCRIPTION OF THE DRAWINGS

FIGS. 3A and -3B are SEM photographs (secondary electron images) at 40 times magnification showing cutting edges of an insert according to the prior art and according to the present invention after turning tests.

FIGS. 4A and 4B are SEM photographs at 29 times magnification showing cutting edges of an insert according to the prior art and according to the present invention after milling tests.

DETAILED DESCRIPTION OF THE PREFERRED EMBODIMENTS OF THE INVENTION

The main phases contained in cemented carbides are WC and a Co-rich binder phase. An optional third phase of cubic transition metal carbides (Ti, Ta, Nb, W, C), usually referred to as the γ phase, may be added to improve the wear resistance of straight WC—Co alloys. Regardless, WC is the main constituent in many commercial cemented carbides. WC has a simple hexagonal crystal structure with two atoms per unit cell: W at (0,0,0) and C at (⅔, 1/3, 1/2).

The basic equilibrium form of WC as a result of liquid phase sintering is a triangular grain bounded by three {1010} and two {1000} planes. The substrate-coating interface is consequently composed of the following interfaces:

coating—WC coating—Co coating—γ (when present)

coating—η (when formed)

In-house TEM observations have revealed that TiCN and TiN coatings grow epitaxially on the interfacial WC grains as does TiC which can also be used. The epitaxial coating-WC interfaces thus formed are dominating and are responsible for the good adhesion of the first coating to the cemented carbide substrate. This is especially the case when chemical cleaning is applied to the substrate before the coating process. This situation is complicated, however, due to the reversible η-phase reaction, as discussed below.

Figure 1:
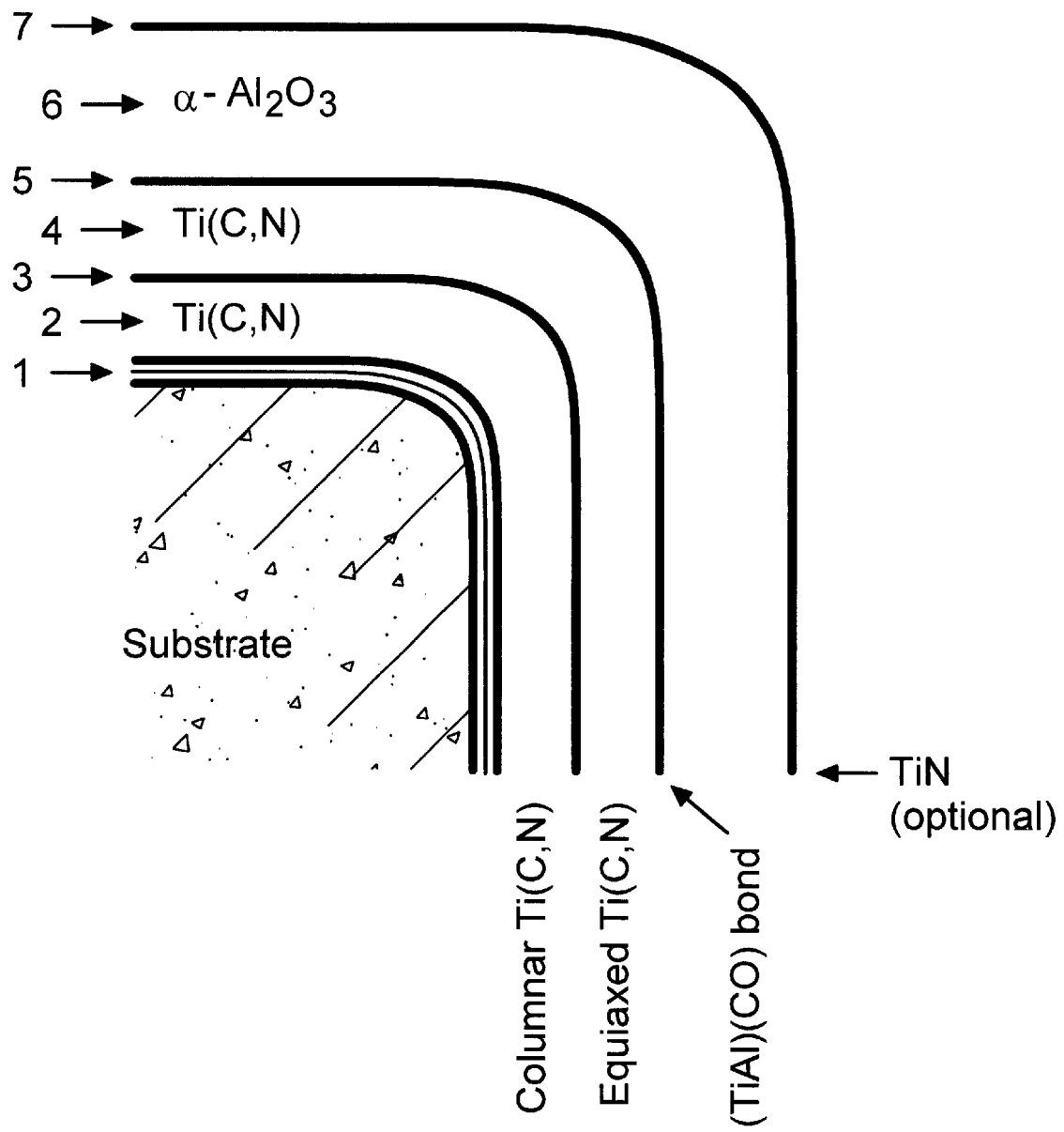
FIG. 1 shows a schematic presentation of a cross-section taken of a corner of a coated cemented carbide insert of the present invention.

The two phase region in WC—Co (or three phase region in WC—Co-γ) cemented carbides is very narrow with respect to the C-content of the alloy and a very small change in the C-content will result in three-phase field alloy (or four phase field alloy in WC—Co-γ) and an η-carbide being formed at reduced C-contents. See, for example, FIG. 1 of page 74 of the *Thin Solid Films* article mentioned above. Consequently, when a Ti(C and/or N) layer is applied using a conventional CVD technique, the carbon for the formation of TiC and/or TiCN or TiN (at low pressure) will be taken partly from the substrate, the substrate being decarburized. The outer part of the substrate is consequently transformed into a $M_{12}C$ type of η-phase. This η-phase is always formed (even though it may be very thin) at least at the edges of the coated inserts (where the surface-bulk ratio is highest resulting in the highest degree of decarburization).

It is emphasized that this η-phase reaction is reversible, especially when relatively thin, and when applied on the substrates with relatively a high carbon content. Consequently, during annealing, the eta-phase will transform back to Co-rich alloy and WC. As evident from the above, this situation is very pronounced at the cutting edges.

For cast iron, relatively thick layers of $\alpha$-$Al_2O_3$ having a thickness of 4–6 μm should preferably be used. The alumina layer is applied on a TiCN layer. The substrate—TiCN— interface is subjected to a heat treatment of a duration of up to six hours during deposition of the alumina layer. During the deposition of the alumina layer, the reversible η-carbide reaction will occur at the substrate-coating interface, resulting in the formation of a Co-rich layer between the TiCN coating and the cemented carbide substrate. This is particularly the case when the η-phase formation has been limited to near-surface regions of the substrate, as is the case at the case when the modern CVD processes are concerned. As a result, the epitaxial TiCN—WC interfaces will be substituted by coating-Co interfaces, resulting in reduced adhesion.

In order to avoid this, the first TiCN layer has to be deposited without decarburization of the substrate. This coating layer is deposited using $CH_3CN$ and $CH_4$ gases as precursors. A coating layer which exhibits a columnar grain structure is formed as a result. The columnar grains have a width of 0.1–0.5 times the coating layer thickness (that is, generally a width of 0.3–1.5 μm) and a length approaching the thickness of the coating layers, preferably of 0.5–0.8 times the coating layer thickness (that is, generally a length of 1.5–8.0 μm). To optimize the amount of epitaxial interfaces and ensure a good adhesion at the interface, the process should be started with a first layer of TiCN, TiC or TiN deposited without $CH_3CN$ and having a very short duration sufficient to form a layer having a thickness of up to 1 μm, preferably up to about 0.5 μm. Diffusion of tungsten will occur into this interfacial layer. This interdiffusion, resulting in a reduced misfit at the coating-WC interface is important for adhesion.

The columnar TiCN layer obtained exhibits, however, an insufficient adhesion to the alumina layer even though bonding layers are applied. In order to improve the bonding adhesion, a CVD TiCN layer composed of equiaxed grains atop the coating of columnar TiCN grains is applied. The grain size of the equiaxed grains is from 0.2 to 1.0 μm, preferably from 0.3 to 0.5 μm. On this equiaxed grained-layer, a bonding layer can be successfully applied resulting in clearly increased adhesion. This total TiCN layer is composed of clearly defined layers of columnar and equiaxed grains of TiCN as shown in the TEM micrograph, FIG. 2.

The bonding layer is a cubic layer of Ti(CO) containing Al. It is important to control this bonding layer so that a whisker-like morphology at the bonding-alumina interface is obtained. The correct chemistry and microstructure of this layer is controlled by adjusting the $TiCl_4$ and $AlCl_3$ ratio of the presursors. At the correct ratio, a whisker-like growth is obtained and up to 10% Al in the bonding layer can be obtained.

The total coating on the cemented carbide insert is comprised of the following layers (FIG. 1):

1. A CVD bonding layer 1 composed of TiC, TiCN or TiN deposited directly on a chemically cleaned substrate where protruding WC grains are dominating. This kind of substrate may also be obtained by modifying sintering processes in accordance with known techniques. This layer is characterized in that diffusion of W from the substrate has occurred into this layer and by epitaxial coating-WC interfaces. The epitaxial orientation relationships are as follows:

On $\{0001\}_{WC}$ planes:
$(111)_{TiCN}//(0001)_{WC}$; $[\bar{1}10]_{TiCN}//[11\bar{2}0]_{WC}$ On $\{10\bar{1}0\}_{WC}$ planes:
$(001)_{TiCN}//(10\bar{1}0)_{WC}$; $[110]_{TiCN}//[0001]_{WC}$ The epitaxial interfaces are responsible for good adhesion at the substrate-coating interface, which is extremely important when turning/milling cast iron.

The thickness of this bonding layer should be up to 1 μm, preferably up to about 0.5 μm.

2. A CVD deposited TiCN layer of columnar crystals 2. This layer is deposited using $CH_3CN$ and $CH_4$ as precursors under MTCVD (medium temperature CVD) conditions. The deposition temperature is from about 800° to 900° C., preferably from about 840° to 860° C. The decarburization of the substrate is avoided, η-carbide is not formed, and the possibility for the reversible η-carbide reaction to occur is eliminated. The epitaxial interfaces created in step 1 are preserved. It should be noted that this layer 2 can also be applied directly on the cemented carbide substrate with epitaxy, and relatively good adhesion. The bonding without $CH_3CN$ (at higher temperatures), however, results in better adhesion, and more pronounced epitaxial growth on WC grains.

3. An optional layer 3 of TiN may be applied between the TiCN layers.

4. A CVD TiCN layer of equiaxed crystal grains 4 deposited atop the MTCVD layer composed of columnar crystals.

The total thickness of the layers 2 and 4 is from 5 to 10 μm, preferably 6–8 μm. The thickness of the columnar TiCN layer 2 is from 2 μm up to 90% of the total thickness of the TiCN layers (layers 2 and 4) depending on the carbon content of the substrate.

5. A bonding layer 5 of cubic (TiAl)(CO). The thickness of this layer is 0.5 to 3.0 μm, preferably about 1.5 μm. Due to the high amount of aluminum in this layer, a whisker-like growth is obtained.

6. An $\alpha$-$Al_2O_3$ coating 6 having a thickness of 4 to 10 μm, preferably about 6 μm for turning and from 1 to 4 μm, preferably about 2 μm, for milling.

7. A TiN top layer having a thickness $\leq$ 1 μm.

The invention is additionally illustrated in connection with the following Examples which are to be considered as illustrative of the present invention. It should be understood, however, that the invention is not limited to the specific details of the Examples.

EXAMPLE 1

Two samples were made according to the prior art:
1) TiCN CVD layer, thickness 6 μmm
   Bonding layer
   α+κ alumina layer, thickness 6 μm
(2) TiCN MTCVD layer, thickness 6 μm
   Bonding layer according to the prior art
   κ alumina layer, thickness 6 μm And two coatings according to the presently claimed invention
  (3) A CVD bonding layer with epitaxy
    TiCN MTCVD layer of columnar grains about 0.5 μm width and 2.5 μm length deposited using CH$_3$CN and CH$_4$, thickness 4 μm
    TiCN CVD layer of equiaxed grains, about 0.5 μm grain size, thickness 2 μm
    A bonding layer
    α-Al$_2$O$_3$ layer having a thickness of 6 μm
  A CVD bonding layer with epitaxy
    TiCN MTCVD layer of columnar grains about 0.5 μm width and 2.5 μm length deposited using CH$_3$CN and CH$_4$, thickness 4 μm
    Optional layer of TiN
    TiCN CVD layer of equiaxed grains, about 0.5 μm grain size, thickness 2 μm
    A bonding layer
    α-Al$_2$O$_3$ layer having a thickness of 6 μm All the coatings had the same TiCN and alumina layer thickness (6+6 μm). The inserts were compared in a scratch adhesion tester. Scratch adhesion tests were carried out using a scratch adhesion tester (Revetest, supplied by LSRH) equipped with an acoustic emission detector (AE). The critical load was recorded utilizing AE signals and further confirmed by SEM. A new diamond stylus was used, its condition being checked after each test. The results are summarized in Table 1.

TABLE 1

| Sample | Alumina Phase | Scratch Adhesion |
| --- | --- | --- |
| 1 | κ | ≤60 |
| 2 | κ (+α) | ≤60 |
| 3 (according to the present invention) | α | ≥90 |
| 4 (according to the present invention) | α | ≥90 |

The samples according to the present invention showed a clearly enhanced adhesion and the coatings were composed of 100% α-Al$_2$O$_3$.

EXAMPLE 2

Samples 1–4 of Example 1 were subjected to cutting tests in cast iron. The cutting parameters were as follows:
Operation: Turning
Material: Cast iron, SS0130
Cutting Speed: 450 m/min
Depth of Cut: 3.0 mm
Feed Rate: 0.3 mm/rev
Insert Geometry: SNUN120408
No coolant was applied.

Edge chipping and life times of the inserts are presented in Table 2. The inserts produced according to this invention outperformed the prior art.

TABLE 2

| Sample | Edge Chipping % After 2 minutes | Edge Chipping % After 5 minutes | Lifetime (minutes) |
| --- | --- | --- | --- |
| 1 | 60 | >90 | 5 |
| 2 | 60 | >90 | 7 |
| 3 | 0 | <10 | 15 |
| 4 | 0 | <10 | 17 |

EXAMPLE 3

Inserts 1 and 4 discussed in Examples 1 and 2 were subjected to a cutting test in cast iron according to the data given in Example 1, except the cutting speed, which was higher, 550 m/min.

As can be seen from the SEM micrographs, FIGS. 3A and 3B, showing inserts 1 and 4 after 5 minutes of turning, respectively, a clearly reduced chipping tendency was shown by the inserts of this invention.

EXAMPLE 4

Figure 2:
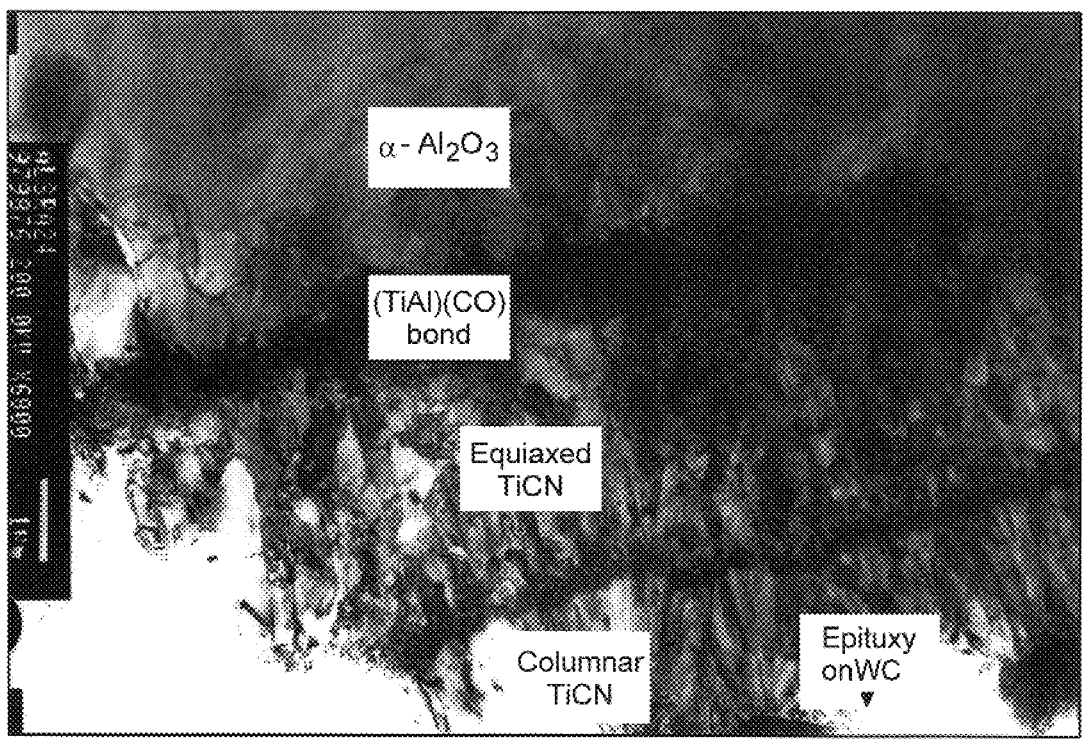
FIG. 2 shows a TEM micrograph of the coating layer according to the present invention.

The coating produced according to the presently claimed invention, coating 4 in Example 1, was studied using transmission electron microscopy (TEM). The microstructure of the coating in cross-section is shown in FIG. 2. The TiCN layer is clearly composed of two distinct layers according to the presently claimed invention. The α-Al$_2$O$_3$ layer deposited on a relatively thick (up to 1 μm) bonding layer can be seen. Also, some of the WC grains at the substrate-coating interface can be seen. The epitaxial relationships at the WC-TiCN interfaces were confirmed using TEM.

EXAMPLE 5

The coatings were deposited according to the presently claimed invention to be used in milling operations. Apart from the coating thicknesses, the deposition procedure was the same as for coating number 4 in Example 1.
  TiCN bonding with epitaxy and W diffusion from the substrate
  TiCN with columnar grains about 0.5 μm width and 2.5 μm length deposited using CH$_3$CN and CH$_4$, thickness 4 μm
  TiN layer (optional)
  TiCN CVD layer of equiaxed grains, about 0.5 μm grain size, thickness 2 μm
  Bonding TiCO+aluminum
  α-Al$_2$O$_3$, 2 μm This coating was compared with a coating of the same thickness produced according to the prior art.
  CVD TiCN with equiaxed grains grain size of 0.7 μm, thickness 4 μm
  Bonding according to the prior art
  α+κ alumina, 2 μm Milling data:
Operation: Face milling
Cutting Speed: 300 m/min
Feed per tooth: 0.15 mm/teeth
Depth of cut: 2.5 mm
Cutting width: 70 mm
Tool geometry: SEKN1203AFTN
No coolant was applied The inserts were investigated after milling distance of 2400 mm. As can be seen from the SEM micrographs, FIGS. 4A and 4B, the insert produced according to the presently claimed invention exhibited clearly reduced edge chipping. This insert exhibited a life time that was about 35% longer than that of the prior art.

All substrates used were commercial cemented carbides, WC-6 wt % Co, having a hardness of about HV 1600.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A coated cemented carbide body comprising a cemented carbide substrate, a multilayer Ti(C,N) intermediate layer and a α-Al$_2$O$_3$ outer layer wherein the Ti(C,N) intermediate layer comprises a first, inner layer of columnar grained Ti(C,N) and a second outer layer of equiaxed grained Ti(C,N), the first inner columnar grained layer being closer to the substrate than the second outer equiaxed grained layer.

2. The coated cemented carbide body of claim 1 wherein there is a bonding layer selected from the group consisting of TiC, TiN and Ti(C,N) between the substrate and the first, inner layer of columnar grains Ti(C,N).

3. The coated cemented carbide body of claim 2 wherein there is a TiN layer between the first and second layers of Ti(C,N).

4. The coated cemented carbide layer of claim 3 wherein the total thickness of the Ti(C,N) intermediate layer is from 5 to 10 microns.

5. The coated cemented carbide body of claim 4 wherein the thickness of the columnar layer is from 2 microns up to 90% of the total thickness of the Ti(C,N) intermediate layer.

6. The coated cemented carbide body of claim 1 wherein there is a layer of (TiAl)(CO) between the second outer layer of the Ti(C,N) layer and the intermediate α-Al$_2$O$_3$ layer.

7. The coated cemented carbide body of claim 6 wherein the (TiAl)(CO) layer has a thickness of from about 0.5 to 3 microns.

8. The coated cemented carbide body of claim 1 wherein the α-Al$_2$O$_3$ layer has a thickness of from about 4 to 10 microns.

9. The coated cemented carbide body of claim 1 wherein there is a layer of TiN over the α-Al$_2$O$_3$ layer.

10. The coated cemented carbide body of claim 9 wherein the TiN layer is about 1 micron or less in thickness.

11. The coated cemented carbide body of claim 1 wherein the said columnar grains Ti(C,N) has a width of 0.1 to 0.5 times the coating layer thickness of 0.5 to 0.8 times the coating layer thickness.

12. The coated cemented carbide body of claim 11 wherein the said equiaxed grained Ti(C.N) has a grain size of from 0.2 to 1.0 μm.

13. The method of cutting cast iron using a coated cemented carbide insert, the improvement comprising using as the insert, the insert of claim 1.

14. A coated cemented carbide body comprising a cemented carbide substrate having a series of sequential layers thereon, said layers in order from the substrate being:
(a) a bonding layer having a thickness of up to 1 μm selected from the group consisting of TiC, TiN and Ti(C,N);
(b) a multilayer TiCN layer comprising a first, inner layer of columnar grained Ti(C,N) having a grain width (W) of 0.1–0.5 times the layer thickness, and a length (L) of 0.5–0.8 times the total layer thickness and a second, outer layer of equiaxed grains having a grain size of from 0.2 to 1.0 μm, the total thickness of the Ti(C,N) layer being from 3 to 5 μm when used for milling and from 5 to 10 μm when used for turning;
(c) a layer of (TiAl)(CO) having a thickness of from about 0.5 to 3 μm;
(d) an α-Al$_2$O$_3$ layer having a thickness of from about 4 to 10 μm; and
(e) an outer layer of about 1 μm or less thickness of TiN.

15. The coated cemented carbide body of claim 14 wherein the equiaxed grains have a grain size of about 0.3 to 0.5 μm.

16. A coated cemented carbide body comprising a cemented carbide substrate having a surface, the surface having a series of sequential layers disposed thereon, said layers comprising, in order beginning from the substrate surface:
(a) a bonding layer selected from the group consisting of TiC, TiN and Ti(C,N);
(b) a multilayer Ti(C,N) layer comprising a first inner layer of columnar grained Ti(C,N), and a second layer of equiaxed grained Ti(C,N);
(c) a layer of (TiAl)(CO); and
(d) a α-Al$_2$O$_3$ layer.

17. The coated cemented carbide body of claim 16, further comprising:
(e) an outer layer of TiN.

* * * * *